United States Patent [19]

Moench

[11] 4,200,917
[45] Apr. 29, 1980

[54] QUIET COLUMN DECODER

[75] Inventor: Jerry D. Moench, Austin, Tex.

[73] Assignee: Motorola, Inc., Schaumburg, Ill.

[21] Appl. No.: 19,990

[22] Filed: Mar. 12, 1979

[51] Int. Cl.$^2$ .................... G11C 11/40; G11C 13/00
[52] U.S. Cl. .................................. 365/208; 307/238; 365/203; 365/206
[58] Field of Search ............... 365/174, 182, 184, 189, 365/203, 206, 208; 307/238, 279

[56] References Cited

U.S. PATENT DOCUMENTS 4,136,292  1/1979  Suzuki et al. ...................... 365/208

*Primary Examiner*—Terrell W. Fears
*Attorney, Agent, or Firm*—Joe E. Barbee

[57] ABSTRACT

A quiet column decoder is provided which is useful in semiconductor memory systems. The quiet column decoder prevents glitches from being coupled into the silicon substrate during the period of time that the sense amplifiers are sensing data on the bit sense lines. The quiet column decoder has double clocked NOR gates which allows the address lines to be continuous non-multiplexed lines. The double clocked NOR gate has two transistors for precharging a first and a second node within the NOR gate. Another transistor is coupled between the second node and a voltage reference terminal to serve as an enabling device for the NOR gate. The first node of the NOR gate serves as an output for the column decoder.

9 Claims, 3 Drawing Figures

QUIET COLUMN DECODER

This invention relates, in general, to address decoders, and more particularly, to an address decoder useful in a semiconductor memory.

High density semiconductor memories typically operate on very low voltage margins, that is, the difference between a logic zero and a logic one stored in a memory and sensed by sense amplifiers within the memory are on the order of tenths of a volt. However, because of the low voltage margins, noise can have a very detrimental effect upon the operation of the memory; particularly, if the noise occurs while the sense amplifier is trying to sense data stored in a memory cell. In an attempt to reduce the affects of noise on the bit sense lines, many memories now employ folded bit sense lines. By having the bit sense line and its complement near each other most noise coupled into the lines tends to become common mode noise. However, folded bit sense lines do not overcome all of the noise problems resulting from injected noise onto the bit sense lines.

In the past, it was sometimes customary for memories to have their X and Y decoders precharged at the same time. Then when the X decoder was reading the row addresses the Y decoders were discharged and had to be re-precharged before the column address could be read. In order to avoid long access times the re-precharging was done during the period of time that the sense amplifiers were sensing data on the bit sense lines. This injected a large noise glitch onto the silicon substrate which in turned capacitively coupled the noise onto the bit sense lines and occasionally caused improper memory operation. It was also sometimes customary for the X and Y addresses to be applied to the same interface pins of the memory chip. Once the address signals reached the internal address buses they were multiplexed and the X addresses were routed on the X address lines to the X decoder while the Y addresses were routed to the Y address lines. The transistors used to multiplex the address lines were generally large and therefore consumed a large amount of silicon area.

Accordingly, it is an object of the present invention to provide a quiet column decoder which does not inject noise onto the silicon substrate at a critical time thereby causing possible destruction of data stored in a semiconductor memory.

Another object of the present invention is to provide a memory system having continuous uninterrupted address lines for both row and column addresses.

Yet a further object of the present invention is to provide a semiconductor memory system having continuous address lines and having a column decoder with double clocked NOR gates.

SUMMARY OF THE INVENTION

In carrying out the above and other objects of the invention, there is provided, in one form, a semiconductor memory having the same address line for row and column decoders and having a quiet column decoder which does not inject noise into the silicon substrate during the time that the sense amplifiers are sensing data on the bit sense lines. The quiet column decoder has a plurality of double clocked NOR gates. Each NOR gate has a first field effect transistor coupled between a first voltage potential and an output node of the NOR gate. The gate electrode of the first transistor is coupled to a first clock signal. A plurality of field effect transistors are coupled between the output node and a second node. The gate electrode of each of the plurality of field effect transistors is coupled to one of the address lines. A second field effect transistor is coupled to the second node and has its gate electrode coupled to the first clock signal. A third field effect transistor is coupled between the second node and a second voltage terminal and has its gate electrode coupled to a second clock signal. When the first clock signal enables the first and second field effect transistors the output node as well as the second node is precharged. The second clock signal does not enable the third transistor until after the row or X address has been read, thereby ensuring that the column decoder remains precharged during the row addressing time.

DETAILED DESCRIPTION OF THE DRAWINGS

Figure 1:
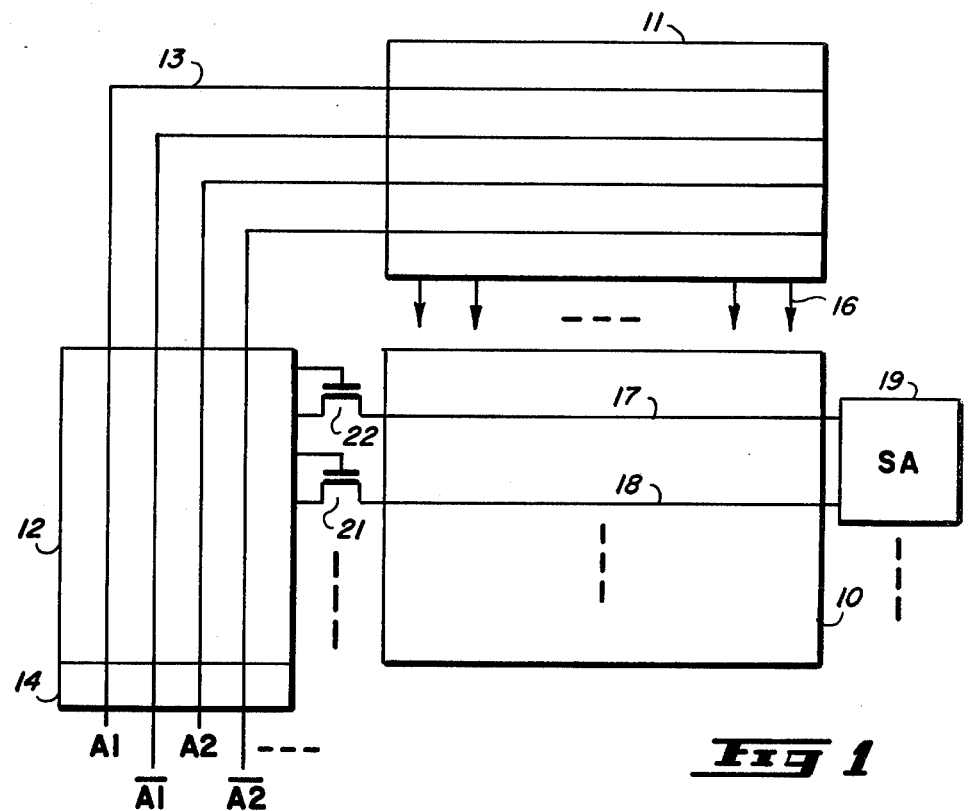
FIG. 1 is a partial block diagram of a memory system.

Referring first to FIG. 1, block 10 represents an array of memory cells. An X decoder or row decoder 11 has word lines 16 going to memory array 10. Y decoder or column decoder 12 is coupled to an address buffer 14. A plurality of address lines 13 is shown as being continuous from address buffer 14 through Y decoder 12 and X decoder 11. Address lines 13 carry addresses A1, Ā1, A2, Ā2, etc. The number of address lines 13 required depends upon the size of the memory array 10. Bit sense line 17 and 18 are coupled to the memory cells in a particular column of memory array 10. Information from the memory cells is sensed by sense amplifier 19. As is well known, amplifier 19 has a latch which will store data from a particular memory cell within memory array 10. Transistors 21 and 22 serve to couple the data stored in sense amplifier 19 onto bit sense common lines. It will be understood that the memory system of FIG. 1 will have many bit sense lines 17 and 18, many transistors 21 and 22, and many sense amplifiers 19 which are not shown for the sake of avoiding overcrowding the drawing.

In a preferred embodiment, the partial block diagram illustrated in FIG. 1 would be representative of one quadrant of a 64K random access memory (RAM). In the preferred embodiment another portion of column decoder 12 would extend directly above illustrated decoder 12 and address lines 13, and another portion of X decoder 11 would extend directly to the left of decoder 11 and address lines 13. Memory array 10 would be duplicated to the left of Y decoder 12 and above extended portion of X decoder 11, and another 16K section of memory would appear directly above the illustrated X decoder 11. The address lines 13, however, would still be continuous address lines and would go to all portions of the X and Y decoders. In many prior art systems, multiplexers were included in the address lines between the X and Y decoders so that the address lines would carry both X and Y addresses. Note that the address lines of the present invention are not interrupted and therefore are simplified. In the system of the present invention the address lines don't have to be isolated from each other or multiplexed.

Figure 2:
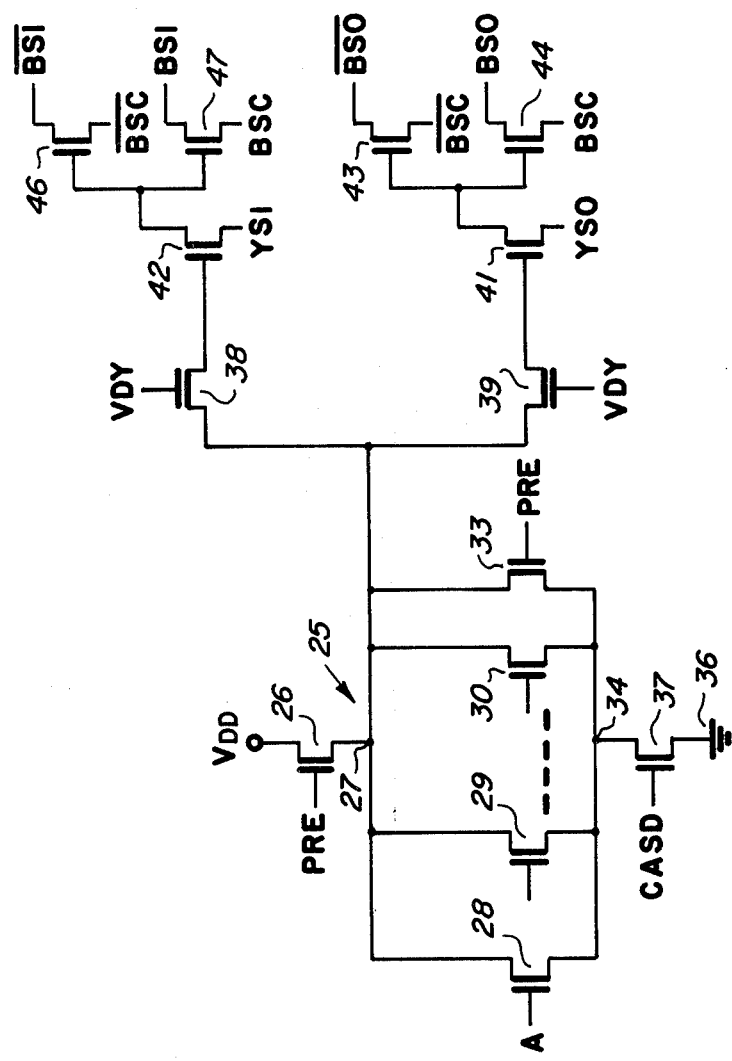
FIG. 2 illustrates in schematic form a portion of the memory system of FIG. 1.

Referring now to FIG. 2, there is illustrated a double clocked NOR gate 25 which is a portion of column decoder 12 (of FIG. 1). Coupled to double clocked NOR gate 25 is additional circuitry used to transfer information from the bit sense lines of the memory array onto bit sense common (BSC) lines which are sometimes called input/output data lines of the memory system.

NOR gate 25 has a transistor 26 coupled between voltage terminal $V_{DD}$ and node 27. Node 27 serves as an output node for NOR gate 25. The gate electrode of transistor 26 is coupled to a precharge signal PRE. A plurality of transistors 28, 29, and 30 are coupled from node 27 to a node 34. Each gate electrode of transistors 28, 29 and 30 is connected to an address line. The total number of transistors coupled between nodes 27 and 34 and having gate electrodes coupled to address lines will correspond to the number of addresses required for the memory system. A field effect transistor 37 is coupled from node 34 to a reference voltage terminal 36 illustrated as ground. The gate electrode of transistor 37 is coupled to a timing signal CASD which is a column address strobe delayed signal. Another transistor 33 is coupled between nodes 27 and 34 and has its gate electrode coupled to the precharge signal PRE.

During the addressing cycle of the memory, the X or row addresses are present on the address lines and transistors 26 and 33 will be enabled by the precharging signal PRE and are therefore precharging nodes 27 and 34. At the end of the X addressing period of time, the precharging signal PRE to transistors 26 and 33 will go to a low level leaving NOR gate 25 in a precharged condition. The timing signal CASD to transistor 37 will then go to a high level thereby enabling transistor 37. Once transistor 37 is enabled, Y addresses appear on the address lines and to the gate electrodes of transistors 28, 29, and 30. The output of NOR gate 25 appears at node 27. Note that although transistor 33 is illustrated as being coupled between nodes 27 and 34 it could just as well be coupled between voltage terminal $V_{DD}$ and node 34 and still accomplish the same function, which is to precharge node 34 to the same voltage potential as node 27 so that node 27 does not become discharged during the X addressing period of time.

The output of NOR gate 25 is coupled to isolation devices 38 and 39. Isolation devices or transistors 38 and 39 have their gate electrodes so connected to clock signal VDY which serves to enable transistors 38 and 39. Transistor 38 is connected to a gate electrode of transistor 42, and transistor 39 is connected to a gate electrode of transistor 41. Transistor 41 is coupled between timing signal YS0 and gate electrodes of transistors 43 and 44. Signal YS0 is a combination of a column select and an address signal. In the preferred embodiment, if eight addresses are required to address a memory system only seven of the addresses will appear in the plurality of transistors between nodes 27 and 34 and the eighth address would be used to derive timing signal YS0. The complement of the eighth address signal would be used to derive YS1. YS1 is coupled to gate electrodes of transistors 46 and 47 by transistor 42. Transistors 46 and 47 are similar to transistors 21 and 22 of FIG. 1 and serve to couple bit sense line $\overline{BS1}$ to bit sense common line $\overline{BSC}$ and bit sense line BS1 to bit sense common line BSC respectively. Transistor 43 couples bit sense line $\overline{BS0}$ to bit sense common line $\overline{BSC}$, and transistor 44 couples bit sense line BS0 to bit sense common line BSC. Bit sense common lines BSC and $\overline{BSC}$ serve as output lines for the memory system. Bit sense lines BS0 and $\overline{BS0}$ are equivalent to lines 17 and 18 of FIG. 1, and transistors 43 and 44 are equivalent to transistors 21 and 22 of FIG. 1.

Figure 3:
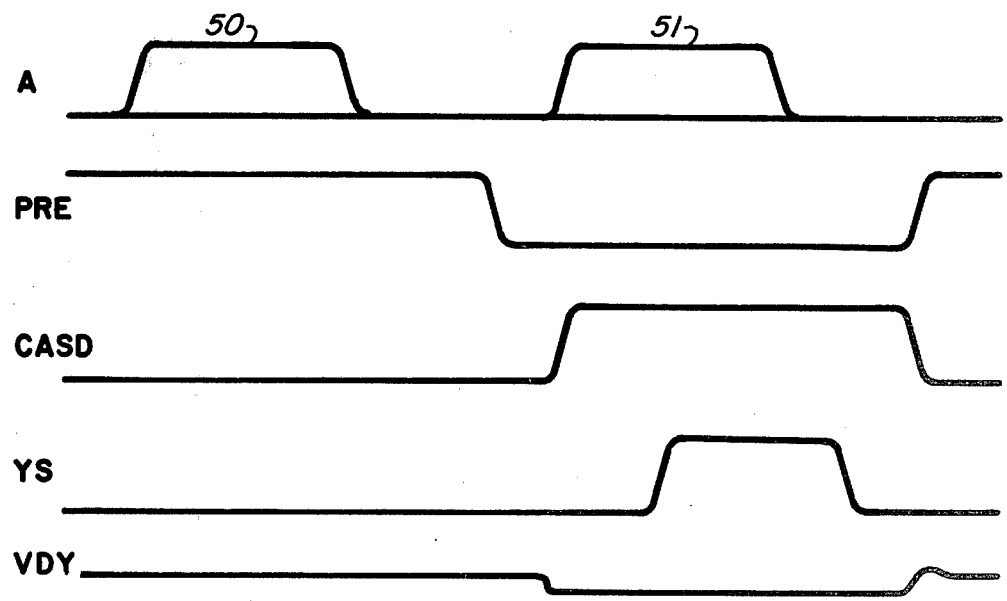
FIG. 3 illustrates some timing waveforms useful in understanding the operation of the circuitry of FIG. 2.

Referring now to FIG. 3, the top waveform A represents the address signals. Portion 50 of waveform A represents when the X addresses are valid and portion 51 represents when the Y addresses are valid. Waveform PRE is the precharge clock signal used to enable transistors 26 and 33. Note that precharge signal PRE is at a high level during the period of time that the X address is valid which is shown by portion 50 of the address waveform A. Column address strobe delayed signal CASD is high during a portion of the time that the precharging signal PRE is low. The precharge signal PRE can keep NOR gate 25 precharged during the X addressing period of time, and since timing signal CASD is low NOR gate 25 will not be active and therefore cannot be discharged. As stated hereinbefore a re-precharging is not needed. A re-precharging of the Y decoder can cause a glitch to be capacitively coupled onto the silicon substrate which can interfere with data on the bit sense lines. The data on the bit sense lines is latched into the sense amplifiers during the period of time that X address is valid. Column select signal YS represents enabling signals for transistors 41 and 42. Waveform VDY represents the enabling signal for isolation transistors 38 and 39. Timing signal VDY changes amplitude just enough to enable and disable transistors 38 and 39.

By now it should be appreciated that there has been provided a quite column decoder for a memory system and in addition has enabled the memory system to have continuous simplified address lines.

I claim:

1. A monolithic integrated circuit memory system having continuous uninterrupted address lines which can carry addresses for both axis of the memory, the memory also having bit sense lines for carrying data to and from memory cells within the memory, comprising: a double clocked NOR gate for decoding address signals and providing an output, the double clocked NOR gate being gated by a first and a second clock signal; an isolation device coupled to the output of the double clocked NOR gate; a transfer device coupled to the isolation device and providing an output; and coupling means for coupling predetermined bit sense lines to output lines, the coupling means being coupled to the transfer device so that the transfer device can control the coupling means.

2. The memory system of claim 1 further including a second isolation device coupled to the output of the double clocked NOR gate, second coupling means, and a second transfer device coupled between the second isolation device and the second coupling means.

3. The memory system of claim 1 wherein the isolation device has a first, a second, and a gate electrode, the first electrode being coupled to the output of the NOR gate, the second electrode being coupled to the transfer device, and the gate electrode being coupled to an enabling signal.

4. The memory system of claim 1 wherein the double clocked NOR gate has a first transistor coupled between a first voltage terminal and the output of the NOR gate and having a gate electrode coupled to the first clock signal, a plurality of transistors coupled to the output of the NOR gate and each having a gate electrode coupled to an address line, a second transistor coupled between the plurality of transistors and a second voltage terminal and having a gate electrode coupled to the second clock signal, and a third transistor coupled to a node formed by the plurality of transistors and the second transistor, the third transistor being for precharging the node, the third transistor having a gate electrode coupled to the first clock signal.

5. A semiconductor memory having a first and a second voltage terminal and having at least a first, a second, and a third timing signal, comprising: a plurality of continuous address lines for carrying X and Y addresses, the address lines being time-shared between X and Y addresses; double clocked NOR gates coupled to the continuous address lines, the NOR gates being clocked by the first and second timing signals and providing an output used in coupling data from bit sense lines of the memory to data output lines of the memory.

6. The memory of claim 5 wherein an isolation device is coupled to the double clocked NOR gate, a transfer device coupled to the isolation device, and a transistor coupled between each of the bit sense lines and the data output lines, the transfer device being coupled to the transistors so that the transistors can be enabled in response to the output of the NOR gate.

7. The memory of claim 6 wherein the double clocked NOR gate has a first transistor coupled between the first voltage terminal and the NOR gate output and having a gate electrode, a plurality of transistors coupled between the NOR gate output and a first node, each of the plurality of transistors having a gate electrode for coupling to one of the continuous address lines, a second transistor coupled in parallel with the plurality of transistors and having a gate electrode coupled to the first clock signal and the gate electrode of the first transistor also being coupled to the first clock signal so that the output and the first node can both be precharged at the same time, and a third transistor coupled between the first node and the second voltage terminal and having a gate electrode coupled to the second timing signal.

8. A monolithic integrated semiconductor memory having a plurality of storage cells arranged in an array forming rows and columns and having a row address decoder for decoding row addresses, and having bit sense lines which are addressed by outputs from a column address decoder, the memory also having a first and a second power supply terminal and at least a first and a second clock signal, comprising: a plurality of continuous address lines for carrying addresses for both row and column decoders; and the column decoder having a plurality of NOR gates each of which has at least two precharging means one of which is for precharging an output node of the NOR gate and the other is for precharging another node of the gate, the two precharging means being enabled by the first clock signal, and each of the NOR gates further having a coupling means for controllably coupling the another node to the second power supply terminal, the coupling means being enabled by the second clock signal.

9. A quiet column decoder for use in a semiconductor memory having the same identical address lines for both row and column decoders of the memory, and the memory further having a first and a second voltage terminal and at least a first and a second clock signal, the quiet column decoder having a plurality of double clocked NOR gates: an output node; a first field effect transistor coupled between the first voltage terminal and the output node and having a gate electrode coupled to the first clock signal; a second node; a plurality of field effect transistors coupled between the output node and the second node, each of the plurality of transistors having a gate electrode coupled to one of the address lines; a second field effect transistor coupled to the second node for precharging the second node and having a gate electrode coupled to the first clock signal; and a third field effect transistor coupled between the second node and the second voltage terminal and having a gate electrode coupled to the second clock signal.

* * * * *